(12) United States Patent
Ito et al.

(10) Patent No.: US 9,106,181 B2
(45) Date of Patent: Aug. 11, 2015

(54) POWER AMPLIFIER CIRCUIT

(71) Applicant: Murata Manufacturing Co., Ltd., Kyoto (JP)

(72) Inventors: Masahiro Ito, Kyoto (JP); Kiichiro Takenaka, Kyoto (JP); Satoshi Tanaka, Kyoto (JP); Hidetoshi Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/552,597

(22) Filed: Nov. 25, 2014

(65) Prior Publication Data

US 2015/0084698 A1    Mar. 26, 2015

Related U.S. Application Data

(63) Continuation of application No. PCT/JP2013/064119, filed on May 21, 2013.

(30) Foreign Application Priority Data

May 25, 2012 (JP) ................................. 2012-119959

(51) Int. Cl.
| H03F 1/14 | (2006.01) |
| H03F 3/04 | (2006.01) |
| H03F 1/02 | (2006.01) |
| H03F 1/32 | (2006.01) |
| H03F 3/24 | (2006.01) |

(Continued)

(52) U.S. Cl.
CPC .............. *H03F 1/0205* (2013.01); *H03F 1/02* (2013.01); *H03F 1/32* (2013.01); *H03F 3/193* (2013.01); *H03F 3/213* (2013.01); *H03F 3/245* (2013.01); *H03F 2200/18* (2013.01); *H03F 2200/372* (2013.01); *H03F 2200/451* (2013.01)

(58) Field of Classification Search
USPC ......................................... 330/292, 294, 296
IPC .................................................. H03F 1/14,3/04
See application file for complete search history.

(56) References Cited

U.S. PATENT DOCUMENTS 5,834,976 A * 11/1998 Tomasini et al. ............. 330/292
6,037,720 A * 3/2000 Wong et al. ................... 315/291

(Continued)

FOREIGN PATENT DOCUMENTS

| JP | 2001-345649 A | 12/2001 |
| JP | 2002-009559 A | 1/2002 |

(Continued)

OTHER PUBLICATIONS

Written Opinion issued in Application No. PCT/JP2013/064119 dated Jul. 30, 2013.

(Continued)

*Primary Examiner* — Patricia T Nguyen
(74) *Attorney, Agent, or Firm* — Pearne & Gordon LLP

(57) ABSTRACT

Linearity and power efficiency in a power amplifier circuit are enhanced. The power amplifier circuit includes a first transistor that amplifies a signal input to the base and that outputs the amplified signal from the collector and a first capacitor that is disposed between the base and the collector of the first transistor and that has voltage dependency of a capacitance value lower than that of a base-collector parasitic capacitance value of the first transistor.

20 Claims, 13 Drawing Sheets

(51) Int. Cl.
*H03F 3/193* (2006.01)
*H03F 3/213* (2006.01)

(56) References Cited

U.S. PATENT DOCUMENTS

| | | | |
|---|---|---|---|
| 2003/0214357 A1* | 11/2003 | Cho et al. | 330/282 |
| 2004/0032700 A1 | 2/2004 | Matsuno | |
| 2005/0110572 A1 | 5/2005 | Morimoto | |
| 2006/0012411 A1* | 1/2006 | De Langen | 327/170 |
| 2008/0026706 A1 | 1/2008 | Shimizu | |
| 2008/0175335 A1 | 7/2008 | Morimoto | |
| 2010/0003932 A1 | 1/2010 | Morimoto | |
| 2012/0139639 A1* | 6/2012 | Scott et al. | 330/293 |
| 2012/0211812 A1* | 8/2012 | Du et al. | 257/296 |

FOREIGN PATENT DOCUMENTS

| | | |
|---|---|---|
| JP | 2002-171139 A | 6/2002 |
| JP | 2005-176331 A | 6/2005 |
| JP | 2006-295371 A | 10/2006 |
| JP | 2007-235525 A | 9/2007 |
| JP | 2008-206142 A | 9/2008 |
| JP | 2010-035158 A | 2/2010 |
| JP | 2012-004821 A | 1/2012 |
| WO | 2006/118147 A1 | 11/2006 |

OTHER PUBLICATIONS

International Search Report issued in Application No. PCT/JP2013/064119 dated Jul. 30, 2013.

* cited by examiner

POWER AMPLIFIER CIRCUIT

BACKGROUND

1. Technical Field

The present invention relates to a power amplifier circuit.

2. Background Art

In a mobile communication device such as a mobile phone, a power amplifier circuit is used to amplify power of a signal to be transmitted to a base station. In recent years, modulation systems such as a high speed uplink packet access (HSUPA) system, a long term evolution (LTE) system, and an LTE-Advanced system, which are high-speed data communication standards, are employed by mobile phones. In such communication standards, in order to enhance a communication speed, it is important to reduce unevenness in phase or amplitude. That is, high linearity is desirable for the power amplifier circuit. In such communication standards, in order to enhance a communication speed, a range (dynamic range) in which an amplitude of a signal varies may often be broadened. In order to enhance linearity when the dynamic range is broad, a high source voltage is desired and thus power consumption in the power amplifier circuit tends to increase.

On the other hand, in a mobile phone, a decrease in power consumption is desirable for extending an available time for calling or communication. For example, Patent Document 1 discloses an envelope tracking system which can achieve enhancement of power efficiency by controlling a source voltage of a power amplifier circuit depending on an amplitude level of an input modulation signal.

CITATION LIST

Patent Document

Patent Document 1: JP 2012-4821

SUMMARY OF THE INVENTION

In order to achieve high linearity in a power amplifier circuit, it is important to control a gain so as to be constant regardless of an amplitude level of a signal. This is true when an envelope tracking system is employed.

FIGS. 17A to 17C are diagrams illustrating characteristics of a transistor used in a power amplifier circuit. FIG. 17A is a diagram illustrating an example of a gain characteristic of the transistor. As illustrated in FIG. 17A, in general, a gain of a transistor is kept at a constant level (small signal gain) until the output power thereof reaches a certain level, and decreases thereafter. Accordingly, for example, when a transistor operates at a point A, power efficiency is high and a phase distortion is small. On the other hand, for example, when the transistor operates at a point B, the phase distortion is large.

For example, as illustrated in FIG. 17B, when a source voltage varies from $V_1$ to $V_3$ and the level of a small signal gain is kept constant ($G_C$) regardless of the level of the source voltage, a gain $G_{ET}$ in the envelope tracking system can be set to the small signal gain $G_C$.

However, in practice, for example, as illustrated in FIG. 17C, the level of the small signal gain may vary depending on the level of the source voltage. Here, for example, when the gain $G_{ET}$ in the envelope tracking system is set to the small signal gain $G_1$ at the source voltage $V_1$, the power efficiency is high and the phase distortion is small at the source voltage $V_1$, but the phase distortion increases at the source voltages $V_2$ and $V_3$. For example, when the gain $G_{ET}$ in the envelope tracking system is set to the small signal gain $G_2$ at the source voltage $V_2$, the phase distortion at the source voltage $V_2$ is improved, but the power efficiency decreases because the source voltage cannot be lowered to $V_1$.

The present invention is made in consideration of the above-mentioned circumstances and an object thereof is to enhance linearity and power efficiency in a power amplifier circuit.

According to an aspect of the present invention, there is provided a power amplifier circuit including: a first transistor that amplifies a signal input to the base and that outputs the amplified signal from the collector; and a first capacitor that is disposed between the base and the collector of the first transistor and that has voltage dependency of a capacitance value lower than that of a base-collector parasitic capacitance value of the first transistor.

According to the present invention, it is possible to enhance linearity and power efficiency in the power amplifier circuit.

DETAILED DESCRIPTION OF THE INVENTION

Figure 1:
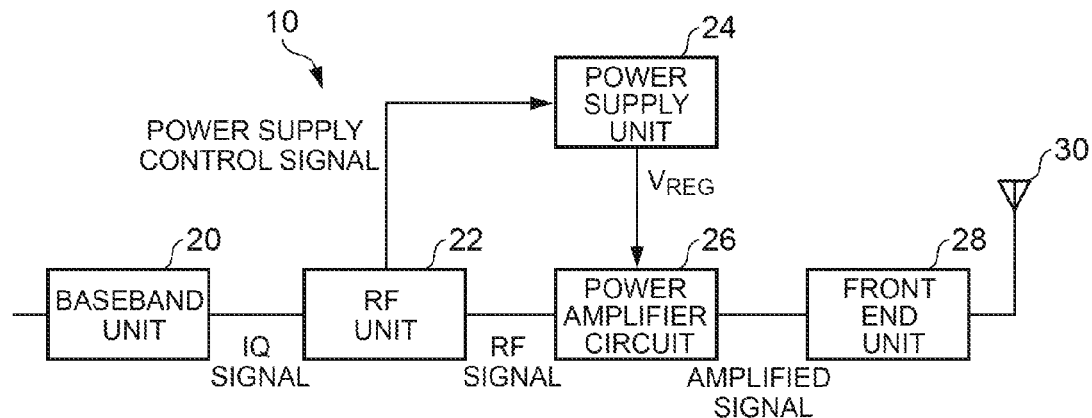
FIG. 1 is a diagram illustrating a configuration example of a transmitter unit including a power amplifier circuit according to an embodiment of the present invention.

Hereinafter, an embodiment of the present invention will be described with reference to the accompanying drawings. FIG. 1 is a diagram illustrating a configuration example of a transmitter unit including a power amplifier circuit according to the embodiment of the present invention. The transmitter unit 10 is used to transmit various signals of voice, data, and the like from a mobile communication apparatus such as a mobile phone to a base station. The mobile communication apparatus also includes a receiver unit for receiving signals from a base station but a description thereof will not be made herein.

As illustrated in FIG. 1, the transmitter unit 10 includes a baseband unit 20, a radio frequency (RF) unit 22, a power supply circuit 24, a power amplifier circuit 26, a front end unit 28, and an antenna 30.

The baseband unit 20 modulates an input signal of voice, data, and the like on the basis of a modulation system such as HSUPA or LTE and outputs a modulation signal. In this embodiment, the modulation signal output from the baseband unit 20 is output as an IQ signal (an I signal and a Q signal) of which the amplitude and the phase are expressed in the IQ plane. The frequency of the IQ signal ranges, for example, from several MHz to several tens of MHz.

The RF unit 22 generates an RF signal (RF) to be wirelessly transmitted from the IQ signal output from the baseband unit 20. For example, the frequency of the RF signal ranges from several hundred MHz to several GHz. The RF unit 22 detects the amplitude level of the modulation signal on the basis of the IQ signal and outputs a power supply control signal to the power supply circuit 24 so that the source voltage $V_{REG}$ to be supplied to the power amplifier circuit 26 has a level corresponding to the amplitude level of the RF signal. That is, RF unit 22 outputs the power supply control signal so as to perform envelope tracking.

In the RF unit 22, instead of directly converting the IQ signal into the RF signal, the IQ signal may be converted into an intermediate frequency (IF) signal and the RF signal may be generated from the IF signal.

The power supply circuit 24 generates the source voltage $V_{REG}$ having a level based on the power supply control signal output from the RF unit 22 and supplies the generated source voltage to the power amplifier circuit 26. For example, the power supply circuit 24 may be constituted by a DC-DC converter that generates the source voltage $V_{REG}$ having the level based on the power supply control signal on the basis of an input voltage.

The power amplifier circuit 26 amplifies power of the RF signal output from the RF unit 22 up to a level appropriate for transmission to a base station and outputs an amplified signal.

The front end unit 28 performs filtering on the amplified signal, switching with a reception signal received from the base station, or the like. The amplified signal output from the front end unit 28 is transmitted to the base station via the antenna 30.

Figure 2:
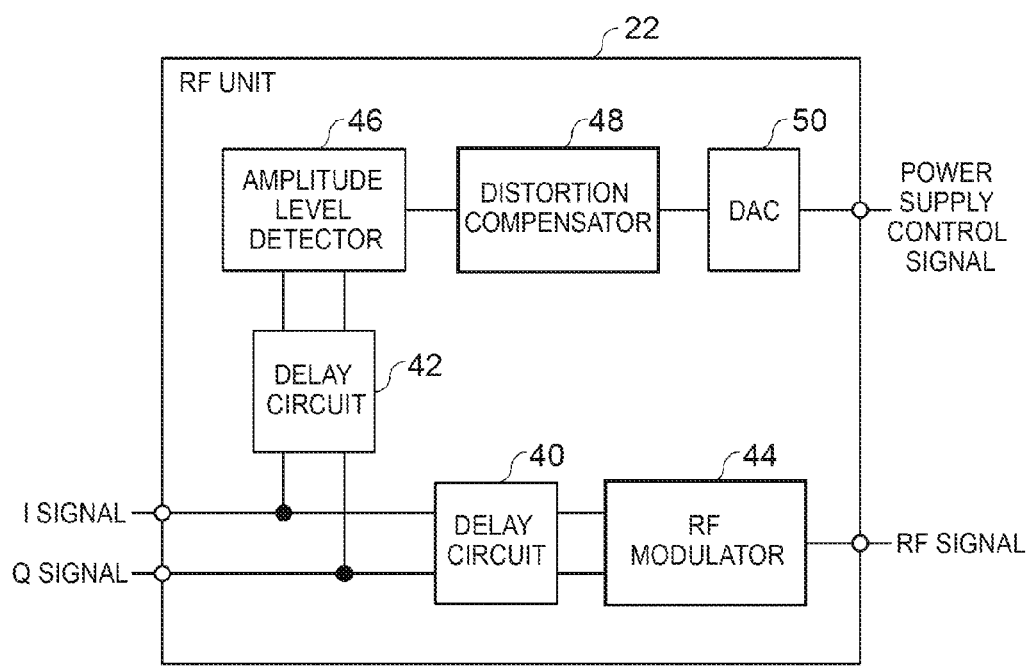
FIG. 2 is a diagram illustrating a configuration example of an RF unit.

FIG. 2 is a diagram illustrating a configuration example of the RF unit 22. As illustrated in FIG. 2, the RF unit 22 includes delay circuits 40 and 42, an RF modulator 44, an amplitude level detector 46, a distortion compensator 48, and a digital-analog converter (DAC) 50.

The delay circuits 40 and 42 are circuits for delaying the IQ signal by a predetermined time so as to match the timing of inputting the RF signal to the power amplifier circuit 26 and the timing of supplying the source voltage $V_{REG}$ based on the amplitude level of the RF signal to the power amplifier circuit 26 with each other.

The RF modulator 44 generates and outputs an RF signal from the IQ signal. Specifically, the RF modulator 44 can acquire the RF signal, for example, by synthesizing the I signal and a carrier signal through the use of a multiplier, synthesizing the Q signal and a carrier signal having a phase shifted by 90 degrees therefrom through the use of a multiplier, and synthesizing the synthesized signals through the use of a subtractor.

The amplitude level detector 46 detects the amplitude level of the modulation signal on the basis of the IQ signal. The detected amplitude level is based on the amplitude level of the RF signal output from the RF modulator 44.

Figure 17A:
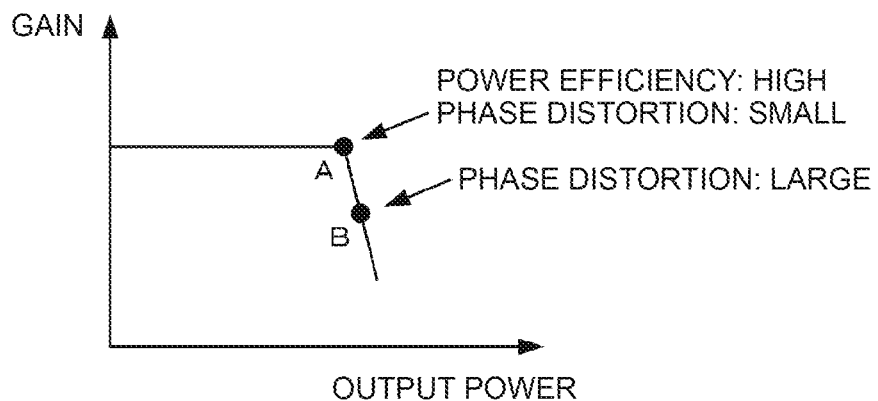
FIG. 17A is a diagram illustrating characteristics of a transistor used in a power amplifier circuit.
Figure 17B:
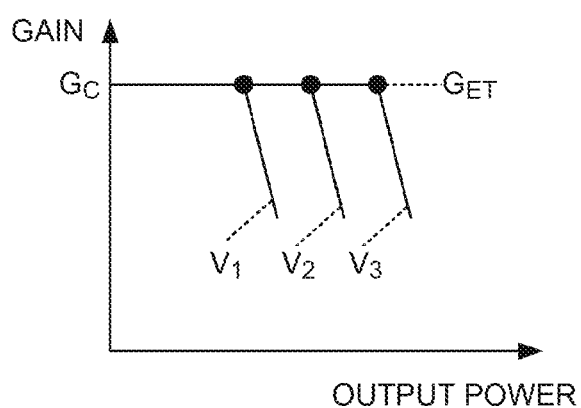
FIG. 17B is a diagram illustrating characteristics of a transistor used in a power amplifier circuit.
Figure 17C:
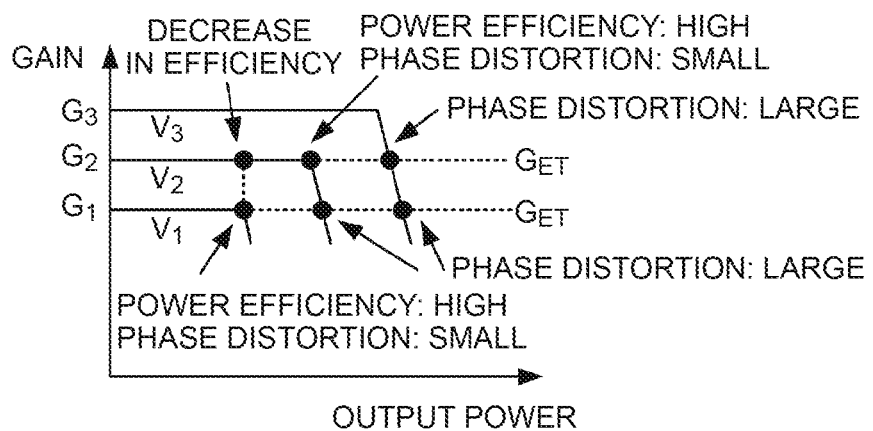
FIG. 17C is a diagram illustrating characteristics of a transistor used in a power amplifier circuit.

The distortion compensator 48 adjusts the level of the source voltage $V_{REG}$ so as not to cause an amplitude distortion in the amplified signal at the time of performing envelope tracking. As illustrated in FIGS. 17A-17C, the gain characteristic of a transistor used for the power amplifier circuit 26 may vary depending on the source voltage $V_{REG}$. Accordingly, in order to maintain linearity in the power amplifier circuit 26, it is desirable to control the source voltage $V_{REG}$ so as to keep the gain constant. For example, the distortion compensator 48 may store a table indicating a correlation between the amplitude level of the modulation signal and the level of the source voltage $V_{REG}$ based on the gain characteristic of the transistor. The distortion compensator 48 can output the power supply control signal for causing the source voltage $V_{REG}$ to have a level corresponding to the amplitude level of the modulation signal on the basis of the stored table.

The DAC 50 converts the power supply control signal output from the distortion compensator 48 into an analog signal and outputs the analog signal.

Figure 3:
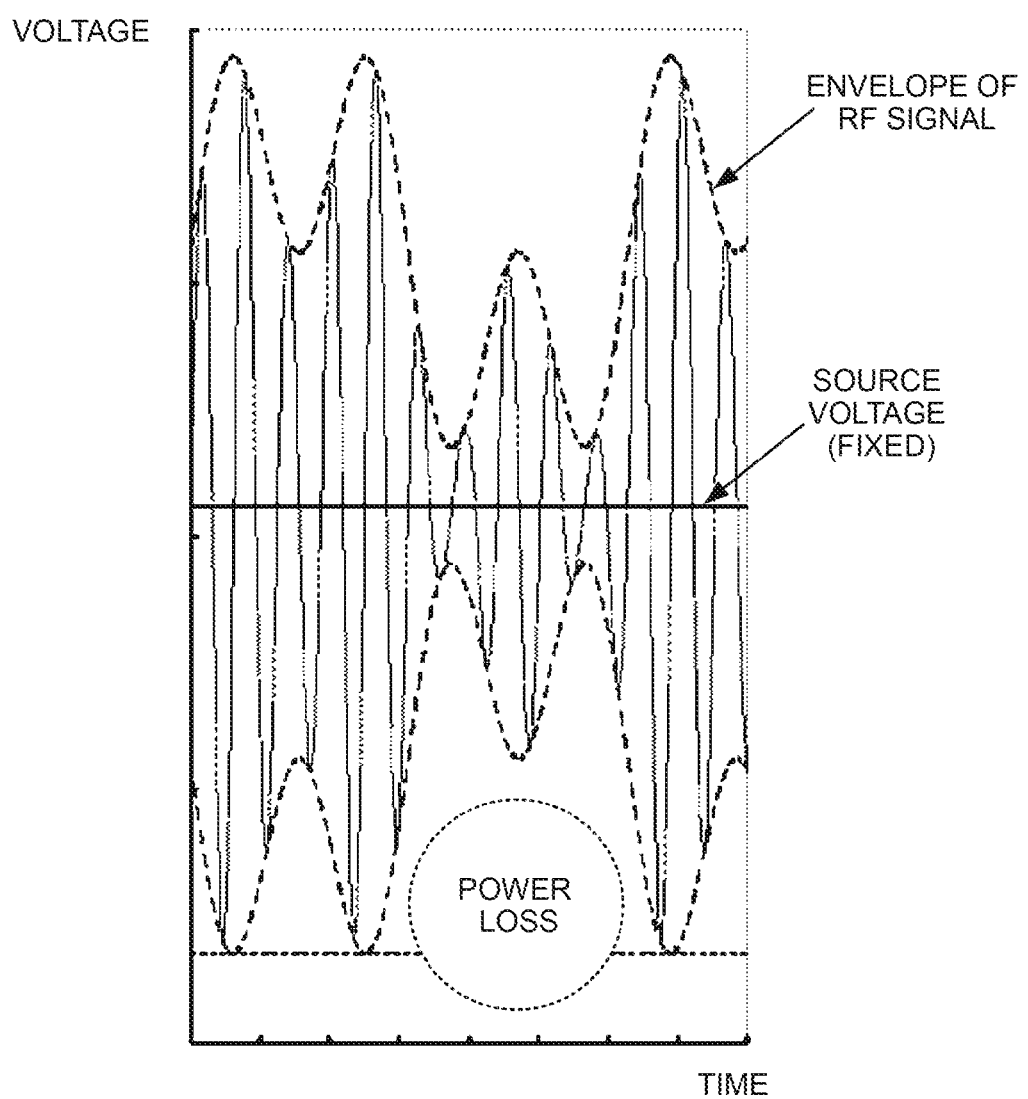
FIG. 3 is a diagram illustrating an example of power loss when power is amplified with a fixed source voltage.

An example of the source voltage control using envelope tracking will be described below with reference to FIGS. 3 and 4. FIG. 3 illustrates an example of power loss when power is amplified with a fixed source voltage. As illustrated in FIG. 3, when the amplitude level of the RF signal greatly varies and the fixed source voltage matched with the maximum amplitude level of the RF signal is employed, the power loss in a section in which the amplitude level of the RF signal is small is large.

Figure 4:
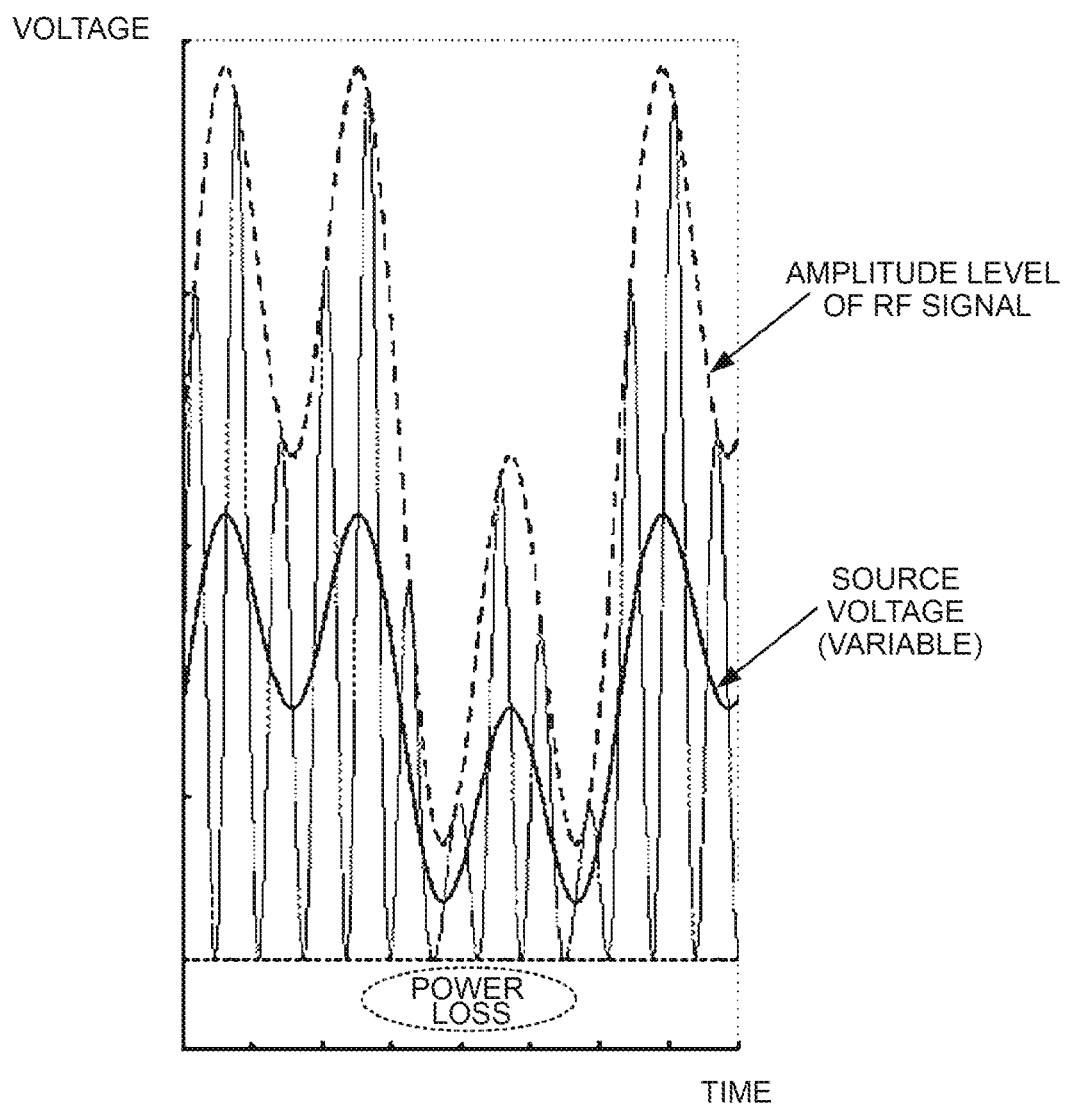
FIG. 4 is a diagram illustrating an example of power loss when power is amplified with a variable source voltage using an envelope tracking system.

FIG. 4 illustrates an example of the power loss when power is amplified with a variable source voltage using envelope tracking As illustrated in FIG. 4, it is possible to reduce the power loss by causing the source voltage to vary depending on the amplitude level of the RF signal.

In this embodiment, the power supply circuit 24 controls the source voltage $V_{REG}$ supplied to the power amplifier circuit 26 to a level corresponding to the amplitude level of the RF signal on the basis of the power supply control signal output from the RF unit 22.

Figure 5:
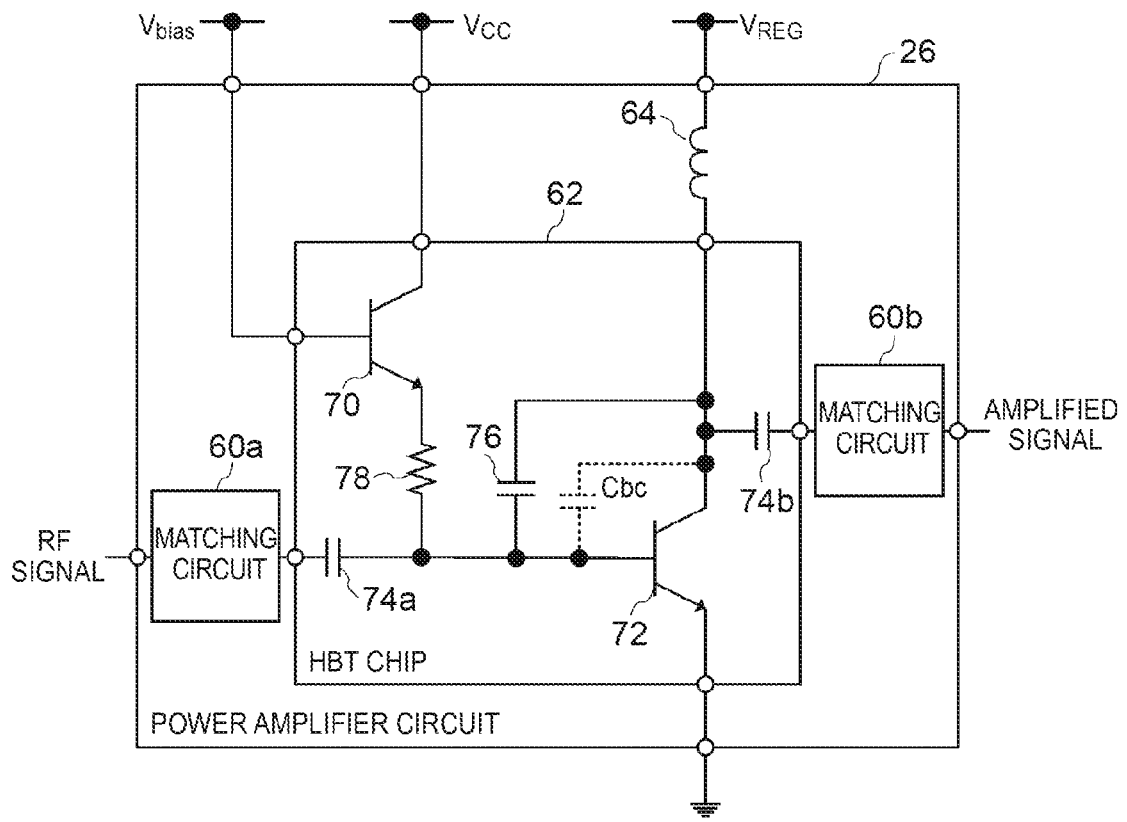
FIG. 5 is a diagram illustrating a configuration example of a power amplifier circuit.

FIG. 5 is a diagram illustrating a configuration example of the power amplifier circuit 26. As illustrated in FIG. 5, the power amplifier circuit 26 includes matching networks 60a and 60b, a hetero junction bipolar transistor (HBT) chip 62, and an inductor 64. The power amplifier circuit 26 amplifies power of an input RF signal and generates an amplified signal. The power amplifier circuit 26 is supplied with a bias voltage $V_{bias}$, a fixed source voltage $V_{CC}$, and a variable source voltage $V_{REG}$.

The matching networks 60a and 60b are used to match impedance. Specifically, the matching network 60a matches the output impedance of the RF unit 22 with the input impedance of the HBT chip 62. The matching network 60b matches the output impedance of the HBT chip 62 with the input impedance of the front end unit 28.

The HBT chip 62 is an integrated circuit including a transistor for amplification of power. As illustrated in FIG. 5, the HBT chip 62 includes HBTs 70 and 72, capacitors 74a, 74b, and 76, and a resistor 78.

The capacitors 74a and 74b are coupling capacitors and can be formed, for example, with a metal insulation metal (MIM) structure. The capacitor 74a outputs an AC component of the RF signal to the subsequent stage. The capacitor 74b outputs an AC component of the amplified signal to the subsequent stage.

The HBT 70 and the resistor 78 constitute a bias circuit for shifting the voltage level of the RF signal output from the capacitor 74a into a dynamic range of the HBT 72. The source voltage $V_{CC}$ is applied to the collector of the HBT 70 and the bias voltage $V_{bias}$ is applied to the base of the HBT 70. The HBT 70 and the resistor 78 constitute an emitter follower circuit and the level of the bias voltage applied to the base of the HBT 72 is controlled on the basis of the bias voltage $V_{bias}$.

The HBT 72 is a transistor for amplifying the RF signal input to the base. The source voltage $V_{REG}$ that is controlled depending on the amplitude level of the RF signal is applied to the collector of the HBT 72 via the inductor 64. The HBT 72 constitutes a common-emitter circuit that amplifies the RF signal input to the base using the source voltage $V_{REG}$.

The capacitor 76 is disposed between the base and the collector of the HBT 72. The voltage dependency of the capacitance of the capacitor 76 is lower than that of the base-collector parasitic capacitance $C_{bc}$ of the HBT 72. The capacitor 76 is provided to suppress a variation of the small signal gain of the HBT 72 with the source voltage $V_{REG}$.

Figure 6:
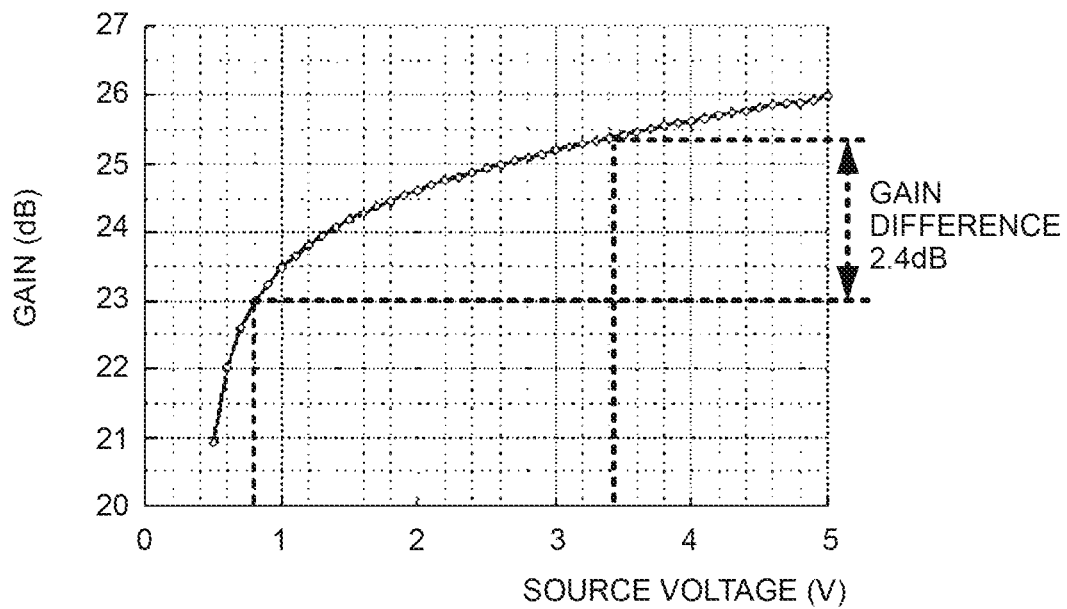
FIG. 6 is a diagram of a simulation result illustrating an example of a relationship between a source voltage and a gain in an HBT.

General characteristics of an HBT will be described below. FIG. 6 is a diagram of a simulation result illustrating an example of a relationship between the source voltage and the gain in the HBT. In the simulation, the capacitor 76 is not disposed between the base and the collector of the HBT. At the source voltage of 3.4 V, the base-collector parasitic capacitance $C_{bc}$ per unit emitter area of the HBT is set to be equal to the base-collector capacitance (the sum of the capacitance of the capacitor 76 and the parasitic capacitance C0 per unit emitter area of the HBT 72. As illustrated in FIG. 6, the gain of the HBT increases with an increase in the source voltage. In the example illustrated in FIG. 6, a gain difference of 2.4 dB occurs between a source voltage of 0.8 V and a source voltage of 3.4 V.

Figure 7:
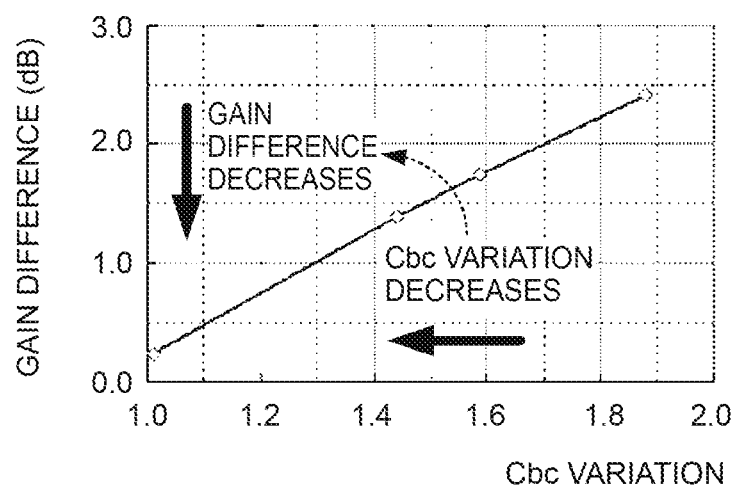
FIG. 7 is a diagram of a simulation result illustrating an example of a relationship between a variation in base-collector capacitance and a gain difference.

FIG. 7 is a diagram of a simulation result illustrating an example of a relationship between the variation of the base-collector capacitance and the gain difference. The horizontal axis represents a ratio of the base-collector capacitance at a source voltage of 0.8 V when it is assumed that the base-collector capacitance at a source voltage of 3.4 V is 1. The vertical axis represents the difference between the gain at a source voltage of 3.4 V and the gain at a source voltage of 0.8 V. In the simulation illustrated in FIG. 6, the variation of the parasitic capacitance $C_{bc}$ which is the base-collector capacitance of the HBT is about 1.9 and the gain difference is about 2.4 dB. As illustrated in FIG. 7, it is confirmed from the simulation that the gain difference decreases by reducing the variation of the base-collector capacitance.

Therefore, in the power amplifier circuit 26 according to this embodiment, the variation of the base-collector capacitance in which the capacitance of the capacitor 76 and the parasitic capacitance $C_{bc}$ of the HBT 72 are combined is reduced by disposing the capacitor 76 between the base and the collector of the HBT 72. The base-collector capacitance (per unit emitter area) of the HBT is an important factor for determining characteristics of the HBT such as a response characteristic to a radio frequency signal.

Figure 8:
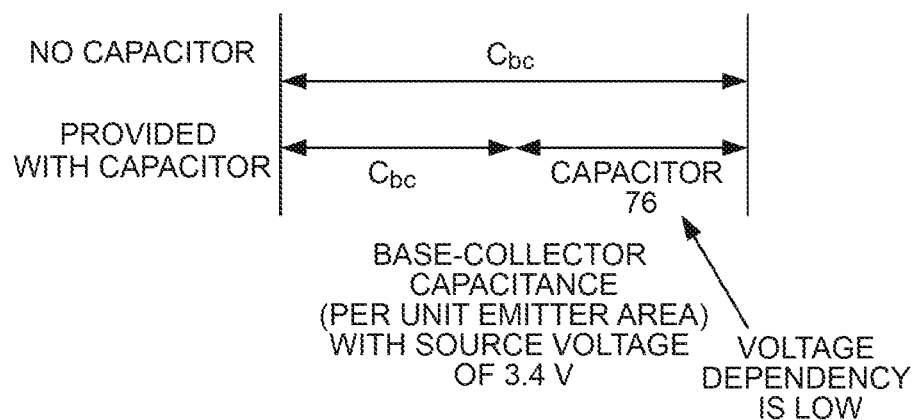
FIG. 8 is a diagram illustrating an example of a relationship between base-collector capacitance values.

FIG. 8 is a diagram illustrating an example of a relationship of the base-collector capacitance values. In this embodiment, the capacitance of the capacitor 76 and the parasitic capacitance $C_{bc}$ are determined so that the base-collector capacitance (per unit emitter area) when an HBT having a general configuration not provided with the capacitor 76 is used is equal to the base-collector capacitance (per unit emitter area) of the HBT 72 provided with the capacitor 76 at a source voltage of a certain level (for example, 3.4 V). As described above, the capacitance of the capacitor 76 depends on a source voltage lower than that of the capacitance $C_{bc}$. Accordingly, by providing the capacitor 76, the source voltage dependency of the base-collector capacitance can be set to be lower than that in a case not provided with the capacitor 76. Since the base-collector capacitance per unit emitter area is maintained, the response characteristic to a radio frequency signal or the like can be maintained in spite of the addition of the capacitor 76.

Figure 9:
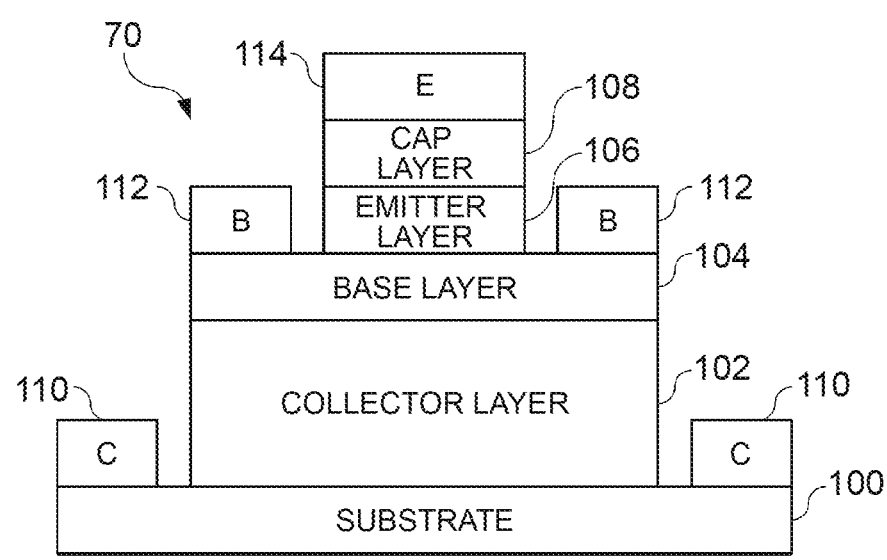
FIG. 9 is a diagram illustrating an example of a cross-sectional structure of an HBT.

FIG. 9 is a diagram illustrating an example of a cross-sectional structure of the HBT 70. As illustrated in FIG. 9, a collector layer 102, a base layer 104, an emitter layer 106, and a cap layer 108 are sequentially formed on a substrate 100. A collector electrode 110, a base electrode 112, and an emitter electrode 114 are formed. In a junction surface between the base layer 104 and the collector layer 102, parasitic capacitance $C_{bc}$ based on the junction area thereof is generated.

Figure 10:
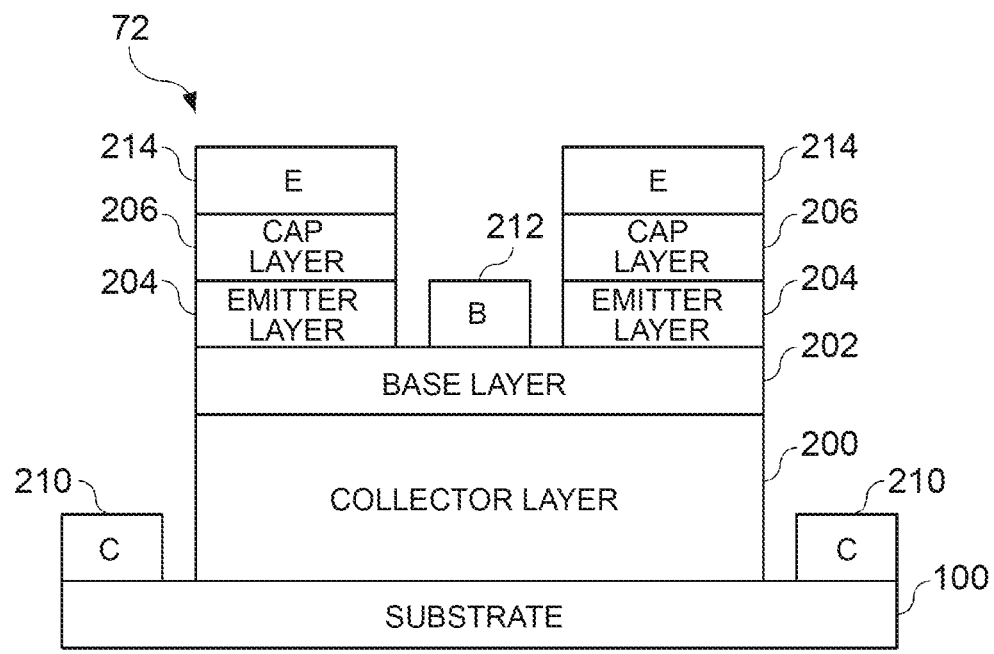
FIG. 10 is a diagram illustrating another example of a cross-sectional structure of an HBT.

FIG. 10 is a diagram illustrating an example of a cross-sectional structure of the HBT 72. Similarly to the HBT 70, a collector layer 200, a base layer 202, an emitter layer 204, and a cap layer 206 are sequentially formed on a substrate 100. A collector electrode 210, a base electrode 212, and an emitter electrode 214 are formed. In a junction surface between the base layer 202 and the collector layer 200, parasitic capacitance $C_{bc}$ based on the junction area thereof is generated.

Now, the relationship between the emitter-base junction area and the base-collector junction area in the structure of the HBT illustrated in FIGS. 9 and 10 will be described. As illustrated in FIG. 10, in the HBT 72, the ratio of the emitter layer 204 to the base layer 202 is set to be greater than that of the HBT 70. Accordingly, the base-collector junction area per unit emitter area in the HBT 72 is set to be smaller than that of the HBT 70. As a result, the base-collector parasitic capacitance $C_{bc}$ per unit emitter area in the HBT 72 is set to be smaller than the base-collector parasitic capacitance $C_{bc}$ per unit emitter area in the HBT 70.

In this way, in this embodiment, the base-collector parasitic capacitance $C_{bc}$ per unit emitter area in the HBT 72 is reduced, for example, by causing the HBT 72 to have the structure illustrated in FIG. 10. The capacitance of the capacitor 76 is determined so that the base-collector capacitance at a certain level (for example, 3.4 V) of a source voltage is equal, for example, to that in a case where the structure illustrated in FIG. 9 is employed.

Accordingly, the source voltage dependency of the base-collector capacitance can be reduced while maintaining the base-collector capacitance at a certain level (for example, 3.4 V) of a source voltage. As a result, the gain difference generated in the HBT 72 can be reduced by reducing the source voltage dependency of the base-collector capacitance as illustrated in FIG. 7.

Figure 11A:
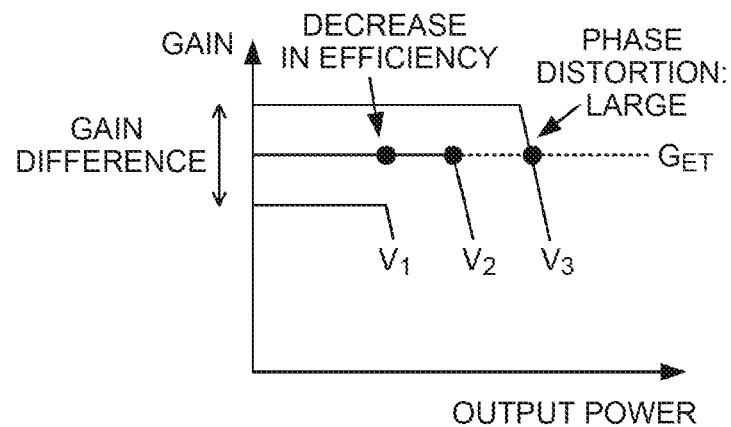
FIG. 11A is a diagram illustrating an example of a relationship among a gain difference, power efficiency, and a phase distortion.
Figure 11B:
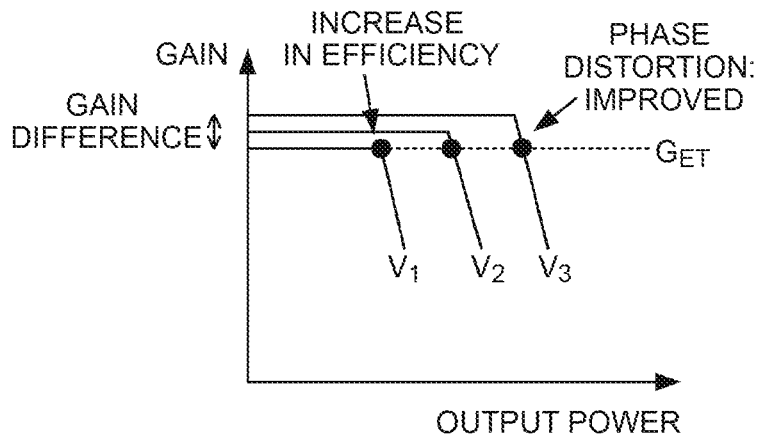
FIG. 11B is a diagram illustrating an example of a relationship among a gain difference, power efficiency, and a phase distortion.

FIGS. 11A and 11B are diagrams illustrating an example of a relationship among the gain difference, the power efficiency, and the phase distortion. When the gain difference is great as illustrated in FIG. 11A, the phase distortion increases at a high amplitude level of the modulation signal and the power efficiency decreases at a low amplitude level of the modulation signal. On the contrary, by reducing the gain difference as illustrated in FIG. 11B, the phase distortion at a high amplitude level of the modulation signal is improved and the power efficiency at a low amplitude level of the modulation signal is improved. That is, it is possible to enhance the linearity and the power efficiency in the power amplifier circuit.

Figure 12:
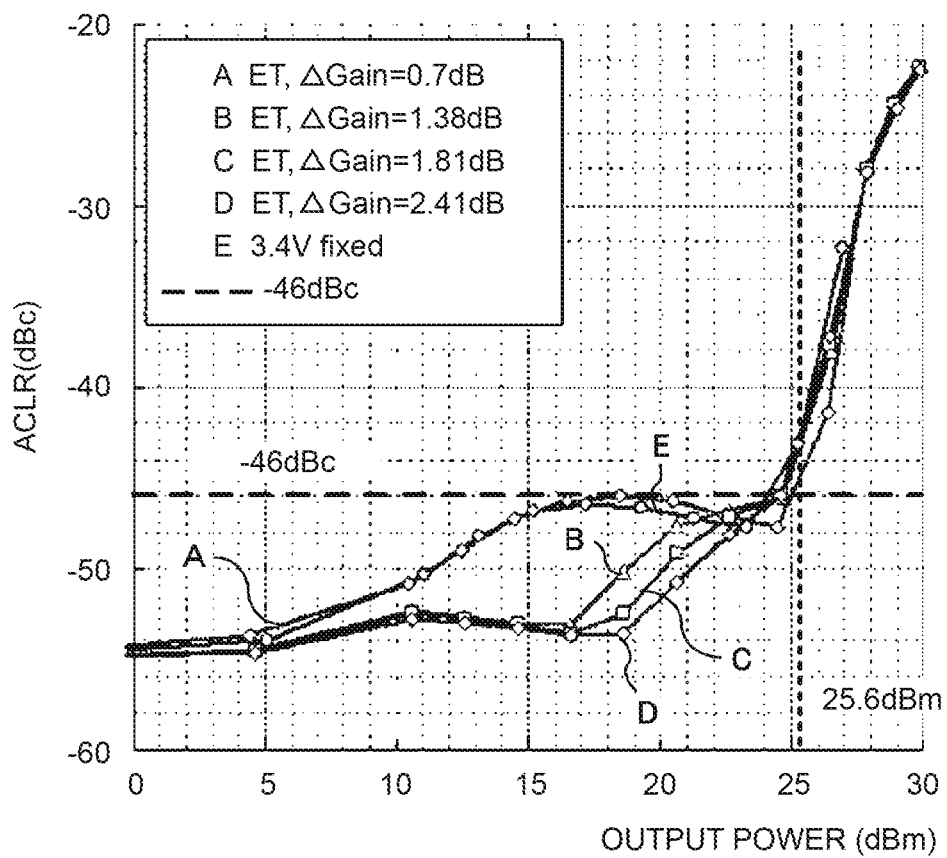
FIG. 12 is a diagram of a simulation result illustrating an example of a relationship between output power and an adjacent channel leakage power ratio.

FIG. 12 is a diagram of a simulation result illustrating an example of a relationship between the output power and the adjacent channel leakage power ratio (ACLR). In the simulation, a modulation signal of HSUPA is used as an amplification target. Lines A to D indicate the relationship between the output power and the ACLR when the source voltage varies with envelope tracking The gain differences in lines A, B, C, and D generated when the source voltage varies from 0.8 V to 3.4 V are 0.7 dB, 1.38 dB, 1.81 dB, and 2.41 dB, respectively. Line E indicates the relationship between the output power and the ACLR when the source voltage is fixed to 3.4 V. In the simulation result illustrated in FIG. 12, the ACLRs in the respective conditions are set to the same degree (about −46 dBc) in the vicinity of the output power of 25.6 dBm.

Figure 13:
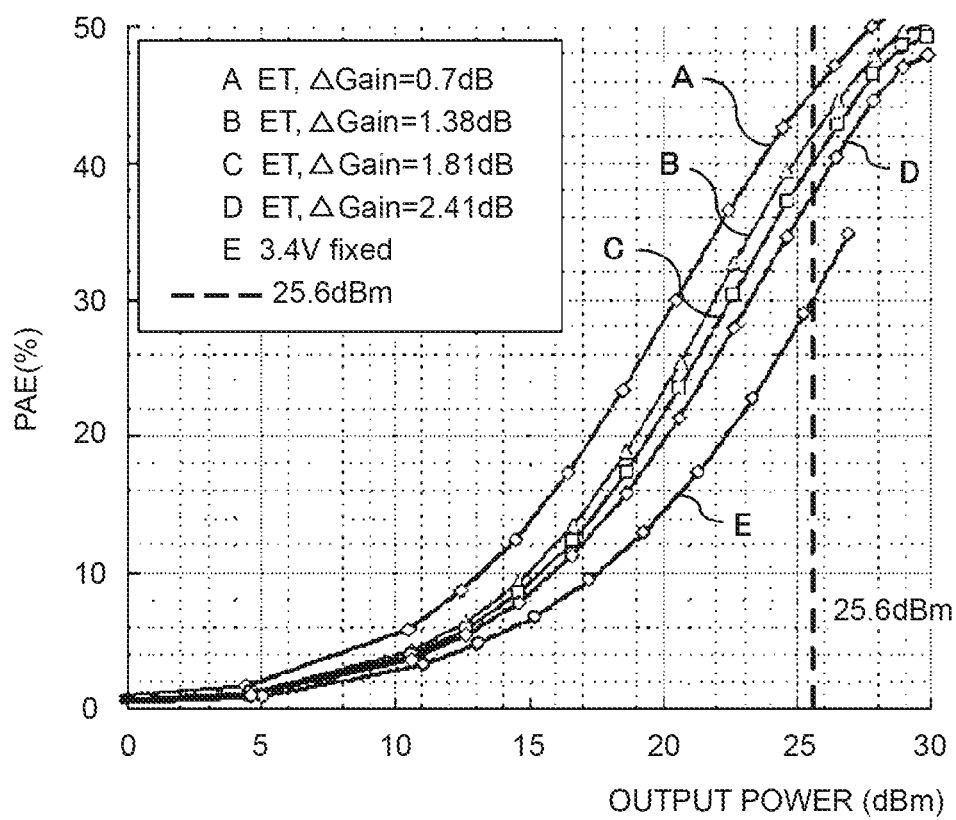
FIG. 13 is a diagram of a simulation result illustrating an example of a relationship between output power and power-added efficiency.

FIG. 13 is a diagram of a simulation result illustrating an example of a relationship between the output power and the power added efficiency (PAE). The simulation conditions are the same as illustrated in FIG. 12. As illustrated in FIG. 12, the ACLRs are equal to each other in the vicinity of the output power of 25.6 dBm. Accordingly, it can be seen that the PAE in the vicinity of the output power of 25.6 dBm increases as the gain difference decreases.

Figure 14:
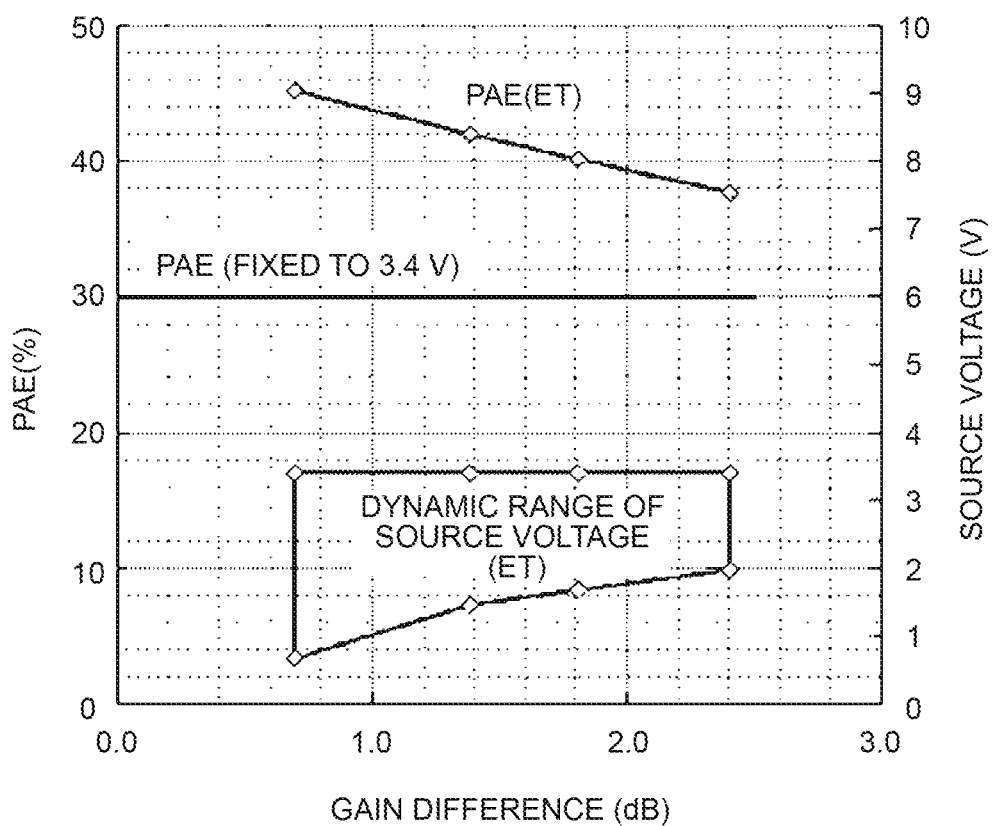
FIG. 14 is a diagram of a simulation result illustrating an example of a relationship among a gain difference, a PAE, and a dynamic range of a source voltage.

FIG. 14 is a diagram of a simulation result illustrating an example of a relationship among the gain difference, the PAE, and the dynamic range of the source voltage at the output power of 25.6 dBm. As illustrated in FIG. 14, the dynamic range of the source voltage in the envelope tracking is broadened as the gain difference decreases. More specifically, as the gain difference decreases, the source voltage can be made to vary to a lower level. Accordingly, as illustrated in FIG. 14, in the envelope tracking, the smaller the gain difference becomes, the higher the PAE becomes.

In this way, it can be seen from the simulation results illustrated in FIGS. 12 to 14 that the power efficiency is improved by reducing the source voltage dependency of the base-collector capacitance of the transistor constituting the power amplifier circuit and thus reducing the gain difference.

The power amplifier circuit illustrated in FIG. 5 has a single-stage configuration, but the power amplifier circuit may have a multi-stage configuration. An example of a power amplifier circuit having a multi-stage configuration will be described below.

Figure 15:
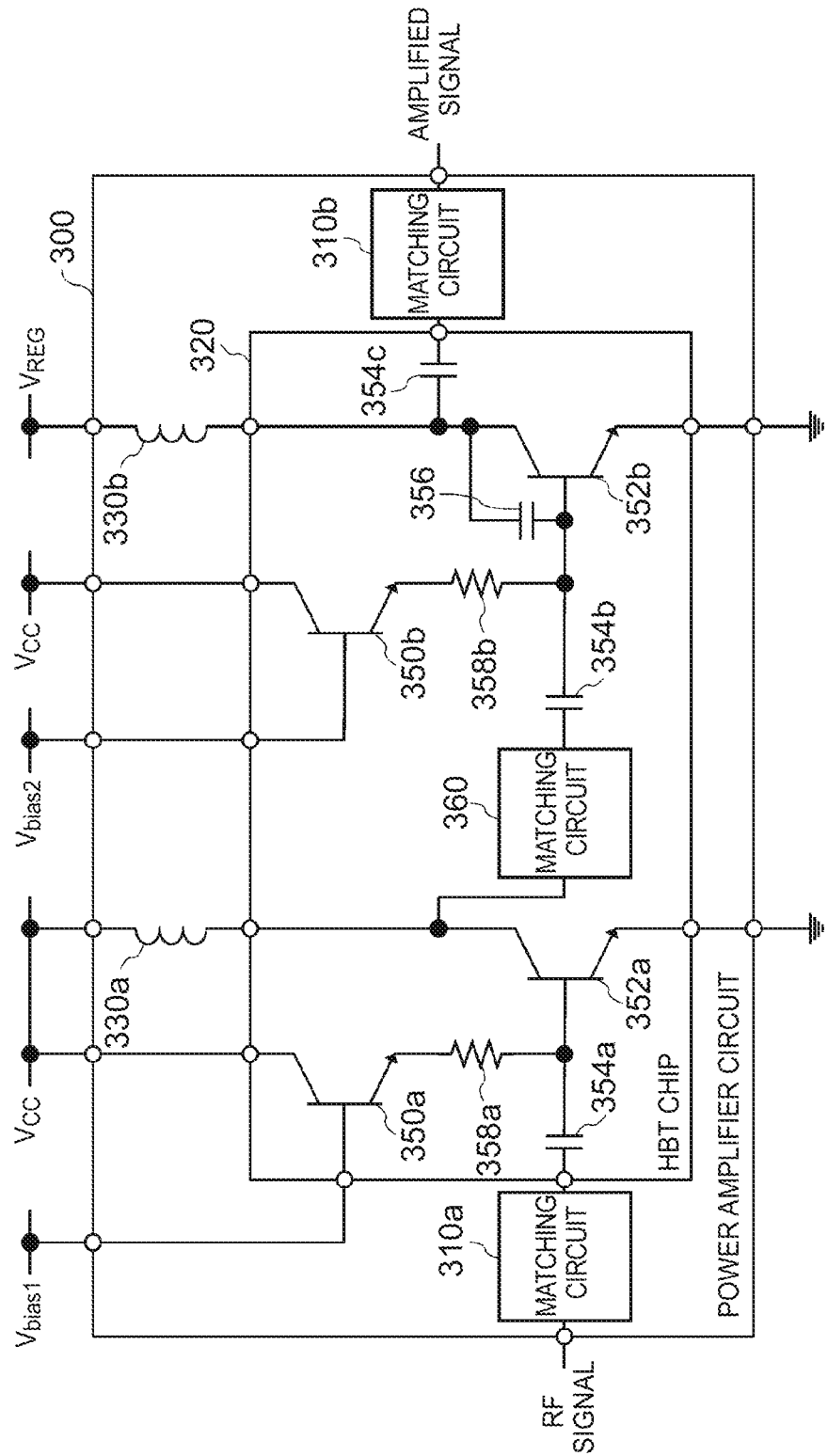
FIG. 15 is a diagram illustrating a configuration example of a two-stage power amplifier circuit.

FIG. 15 is a diagram illustrating a configuration example of a two-stage power amplifier circuit. The power amplifier circuit 300 includes matching networks 310a and 310b, an HBT chip 320, and inductors 330a and 330b. The power amplifier circuit 300 is a two-stage amplifier circuit and can be used instead of the power amplifier circuit 26 illustrated in FIG. 5.

The matching networks 310a and 310b are used to match input impedance and output impedance, similarly to the matching networks 60a and 60b in the power amplifier circuit 26.

The HBT chip 320 includes HBTs 350a, 350b, 352a, and 352b, capacitors 354a, 354b, 354c, and 356, resistors 358a and 358b, and a matching network 360.

The capacitors 354a, 354b, and 354c are coupling capacitors. The capacitor 354a outputs the AC component of an RF signal to the first-stage HBT 352a. The capacitor 354b outputs the AC component of the first-stage output to the second-stage HBT 352b. The capacitor 354c outputs the AC component of the second-stage output to the subsequent stage.

The HBT 350a and the resistor 358a constitute a bias circuit for shifting the voltage level of the RF signal output from the capacitor 354a into a dynamic range of the first-stage HBT 352a. Similarly, the HBT 350b and the resistor 358b constitute a bias circuit for shifting the voltage level of the RF signal output from the capacitor 354b into a dynamic range of the second-stage HBT 352b.

The first-stage HBT 352a constitutes a common-emitter circuit that performs first-stage amplification. A fixed source voltage $V_{CC}$ is applied to the collector of the first-stage HBT 352a via the inductor 330a. That is, the first-stage HBT 352a performs power amplification based on the fixed source voltage instead of the envelope tracking The first-stage HBT 352a may have, for example, a configuration equivalent to the HBT 70 illustrated in FIG. 9.

The second-stage HBT 352b constitutes a common-emitter circuit that performs second-stage amplification. A source voltage $V_{REG}$ controlled depending on the amplitude level of the RF signal is applied to the collector of the second-stage HBT 352b via the inductor 330b. The second-stage HBT 352b may have, for example, a configuration equivalent to the HBT 72 illustrated in FIG. 10.

The capacitor 356 is disposed between the base and the collector of the second-stage HBT 352b. The capacitor 356 is provided to reduce the voltage dependency of the base-collector capacitance of the second-stage HBT 352b, similarly to the capacitor 76 in the power amplifier circuit 26.

The matching network 360 is used to match the first-stage impedance with the second-stage impedance.

In the power amplifier circuit 300, a fixed source voltage $V_{CC}$ is applied to the collector of the first-stage HBT 352a. Accordingly, in the first-stage HBT 352a, it is not appropriate to consider the variation of the base-collector capacitance depending on the variation of the source voltage. As a result, a capacitor is not disposed between the base and the collector of the first-stage HBT 352a.

On the other hand, a variable source voltage $V_{REG}$ corresponding to the amplitude level of the RF signal is applied to the collector of the second-stage HBT 352b. Accordingly, in the second-stage HBT 352b, it is desirable to consider the variation of the base-collector capacitance depending on the variation of the source voltage. As a result, the capacitor 356 is disposed between the base and the collector of the second-stage HBT 352b.

In this way, in a multi-stage power amplifier circuit in which the amplification based on the fixed source voltage and the amplification based on the variable source voltage are combined, it is possible to enhance the linearity and the power efficiency in the power amplifier circuit by providing a capacitor between the base and the collector of the HBT to which the variable source voltage is supplied.

Figure 16:
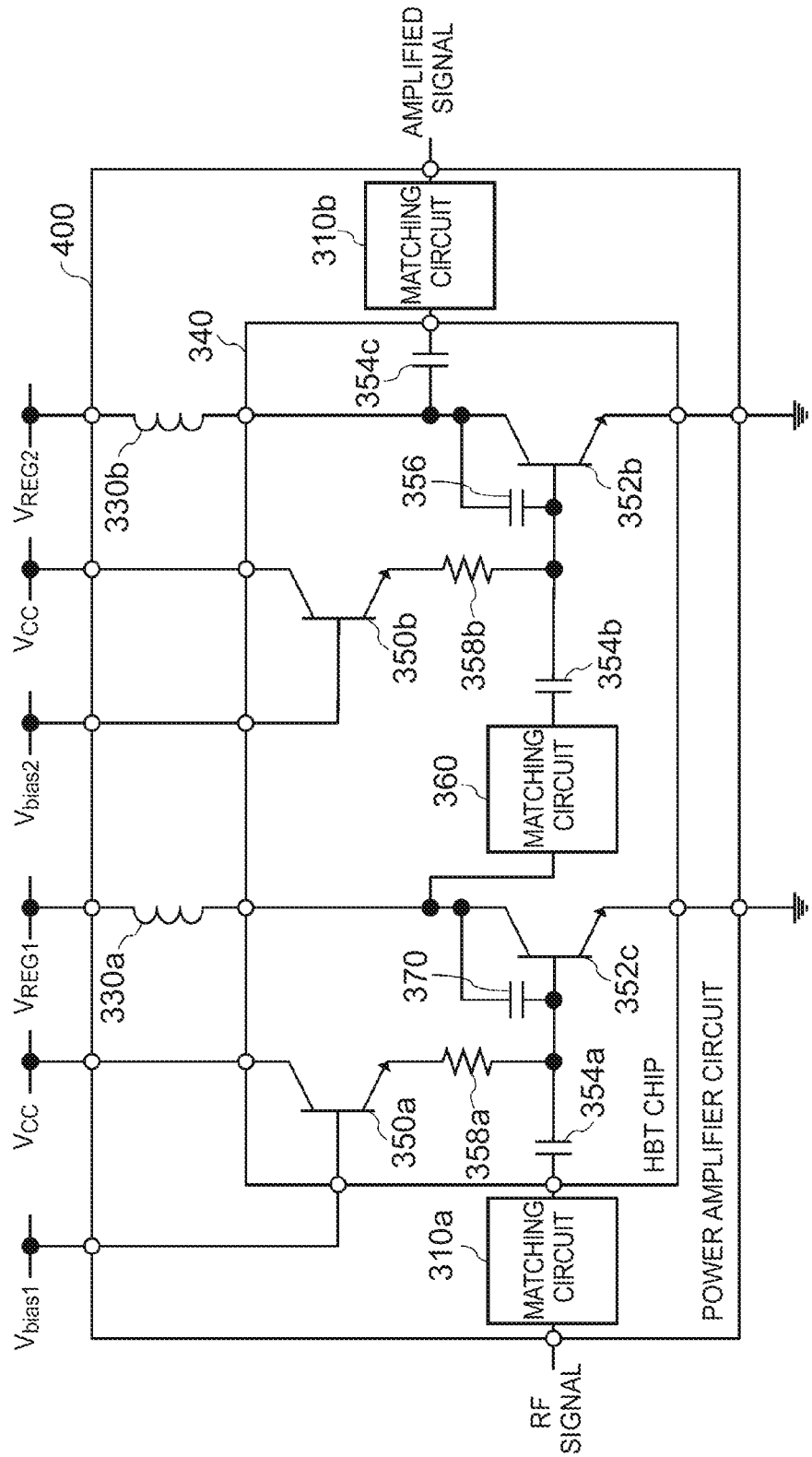
FIG. 16 is a diagram illustrating another configuration example of the two-stage power amplifier circuit.

FIG. 16 is a diagram illustrating another configuration example of the two-stage power amplifier circuit. In the power amplifier circuit 400 illustrated in FIG. 16, the HBT chip 320 in the power amplifier circuit 300 illustrated in FIG. 15 is replaced with an HBT chip 340.

In the HBT chip 340, the first-stage HBT 352a in the HBT chip 320 is replaced with an HBT 352c, and a capacitor 370 is disposed between the base and the collector of the HBT 352c. The HBT 352c may have, for example, a configuration equivalent to the HBT 72 illustrated in FIG. 10. The capacitor 370 is provided to reduce the voltage dependency of the base-collector capacitance of the HBT 352c, similarly to the capacitor 356.

In the power amplifier circuit 400, a variable source voltage $V_{REG1}$ corresponding to the amplitude level of the RF signal is applied to the collector of the HBT 352c via an inductor 330a. A variable source voltage $V_{REG2}$ corresponding to the amplitude level of the RF signal is applied to the collector of the second-stage HBT 352b via an inductor 330b. That is, in the power amplifier circuit 400, the envelope tracking is performed in both of the first stage and the second stage.

In this way, when the envelope tracking is performed in plural stages, it is also possible to enhance the linearity and the power efficiency in the power amplifier circuit by providing a capacitor between the base and the collector of the HBT to which the variable source voltage is applied.

This embodiment is provided for facilitating understanding of the present invention and is not provided for limiting the present invention. The present invention can be modified/improved without departing from the gist thereof and the present invention includes equivalents thereof.

For example, in this embodiment, an HBT is used as an example of a transistor, but the transistor is not limited to the HBT and may employ an arbitrary bipolar transistor.

For example, in this embodiment, the capacitor disposed between the base and the collector is provided in a chip, but the capacitor disposed between the base and the collector may be externally attached to the chip.

For example, in this embodiment, the two-stage power amplifier circuit is used as the multi-stage power amplifier circuit, but the number of stages of the power amplifier circuit may be three or more.

DESCRIPTION OF REFERENCE SIGNS

10: transmitter unit
20: baseband unit
22: RF unit
24: power supply unit
26: power amplifier circuit
28: front end unit
30: antenna
40, 42: delay circuit
44: RF modulator
46: amplitude level detector
48: distortion compensator
50: DAC
60a, 60b: matching network
62: HBT chip
64: inductor
70, 72: HBT
74a, 74b, 76: capacitor
78: resistor
100: substrate
102, 200: collector layer
104, 202: base layer
106, 204: emitter layer
108, 206: cap layer
110, 210: collector electrode
112, 212: base electrode
114, 214: emitter electrode
300, 400: power amplifier circuit
310a, 310b, 360: matching network
320, 340: HBT chip
330a, 330b: inductor
350a, 350b, 352a, 352b, 352c: HBT
354a, 354b, 354c, 356, 370: capacitor
358a, 358b: resistor

The invention claimed is:

1. A power amplifier circuit comprising:
a first transistor configured to amplify a signal input to a base of the first transistor and output an amplified signal from a collector of the first transistor; and
a first capacitor disposed between the base and the collector of the first transistor and having voltage dependency of a capacitance value lower than that of a base-collector parasitic capacitance value of the first transistor.

2. The power amplifier circuit according to claim 1, wherein a source voltage varying depending on an amplitude of the signal is applied to the collector of the first transistor.

3. The power amplifier circuit according to claim 1, further comprising a second transistor,
wherein a parasitic capacitance value per unit emitter area in the first transistor is smaller than a base-collector parasitic capacitance value per unit emitter area in the second transistor.

4. The power amplifier circuit according to claim 3, wherein the second transistor is a transistor configured to supply a bias to the first transistor.

5. The power amplifier circuit according to claim 3, wherein the second transistor is a transistor configured to amplify the signal and output the amplified signal to the base of the first transistor.

6. The power amplifier circuit according to claim 1, further comprising:
a third transistor configured to amplify the signal and output the amplified signal to the base of the first transistor; and
a second capacitor disposed between a base and a collector of the third transistor and having voltage dependency of a capacitance value lower than that of a base-collector parasitic capacitance value of the third transistor.

7. The power amplifier circuit according to claim 6, wherein a source voltage varying depending on an amplitude of the signal is applied to the collector of the third transistor.

8. The power amplifier circuit according to claim 6, further comprising:
a second transistor and a fourth transistor configured to supply a bias to the first transistor and third transistor, respectively,
wherein a collector of the second transistor is connected to the base of the first transistor and a collector of the fourth transistor is connected to a base of the third transistor.

9. The power amplifier circuit according to claim 8, wherein a parasitic capacitance value per unit emitter area in the first transistor is smaller than the base-collector parasitic capacitance value per unit emitter area in the second transistor, and a parasitic capacitance value per unit emitter area in the third transistor is smaller than the base-collector parasitic capacitance value per unit emitter area in the fourth transistor.

10. The power amplifier circuit according to claim 6, wherein an impedance matching circuit is disposed between the collector of the third transistor and the base of the first transistor.

11. The power amplifier circuit according to claim 3, wherein the first transistor, second transistor, and first capacitor are formed on a single chip.

12. The power amplifier circuit according to claim 8, wherein the first transistor, second transistor, third transistor, fourth transistor, first capacitor, and second capacitor are formed on a single chip.

13. The power amplifier circuit according to claim 2, further comprising a second transistor, wherein a parasitic capacitance value per unit emitter area in the first transistor is smaller than a base-collector parasitic capacitance value per unit emitter area in the second transistor.

14. The power amplifier circuit according to claim 13, wherein the second transistor is a transistor configured to amplify the signal and output the amplified signal to the base of the first transistor.

15. The power amplifier circuit according to claim 13, wherein the second transistor is a transistor configured to supply a bias to the first transistor.

16. The power amplifier circuit according to claim 2, further comprising:
   a third transistor configured to amplify the signal and output the amplified signal to the base of the first transistor; and
   a second capacitor disposed between a base and a collector of the third transistor and having voltage dependency of a capacitance value lower than that of a base-collector parasitic capacitance value of the third transistor.

17. The power amplifier circuit according to claim 16, wherein a source voltage varying depending on an amplitude of the signal is applied to the collector of the third transistor.

18. The power amplifier circuit according to claim 17, further comprising:
   a second transistor and a fourth transistor configured to supply a bias to the first transistor and third transistor, respectively,
   wherein a collector of the second transistor is connected to the base of the first transistor and a collector of the fourth transistor is connected to a base of the third transistor.

19. The power amplifier circuit according to claim 18, wherein a parasitic capacitance value per unit emitter area in the first transistor is smaller than the base-collector parasitic capacitance value per unit emitter area in the second transistor, and a parasitic capacitance value per unit emitter area in the third transistor is smaller than the base-collector parasitic capacitance value per unit emitter area in the fourth transistor.

20. The power amplifier circuit according to claim 18, wherein the first transistor, second transistor, third transistor, fourth transistor, first capacitor, and second capacitor are formed on a single chip.

* * * * *

UNITED STATES PATENT AND TRADEMARK OFFICE
CERTIFICATE OF CORRECTION

| | | |
|---|---|---|
| PATENT NO. | : 9,106,181 B2 | Page 1 of 1 |
| APPLICATION NO. | : 14/552597 | |
| DATED | : August 11, 2015 | |
| INVENTOR(S) | : Masahiro Ito | |

It is certified that error appears in the above-identified patent and that said Letters Patent is hereby corrected as shown below:

In the specification,

Column 5, line 43, please replace "CO" with -- $C_{bc}$ --

Signed and Sealed this
Ninth Day of February, 2016

Michelle K. Lee
*Director of the United States Patent and Trademark Office*